SWITCHING CIRCUIT INCLUDING PLURAL RANKS OF DIFFERENTIAL CIRCUITS
Filed June 15, 1967 2 Sheets-Sheet 1
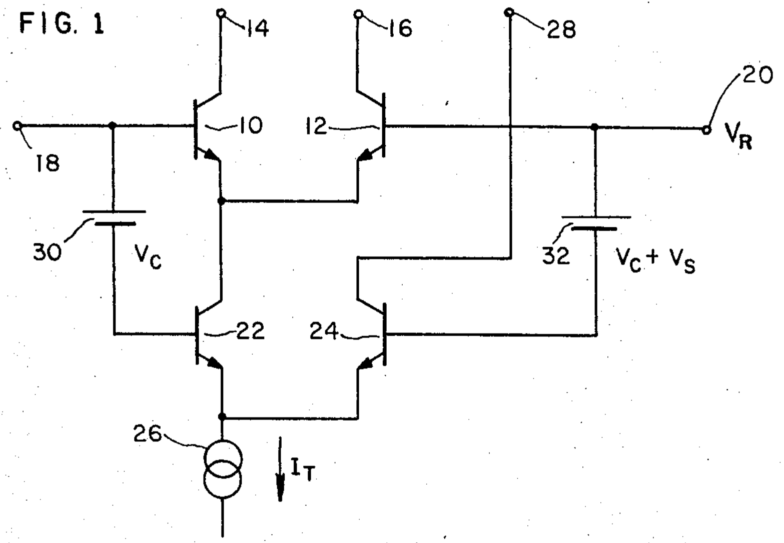
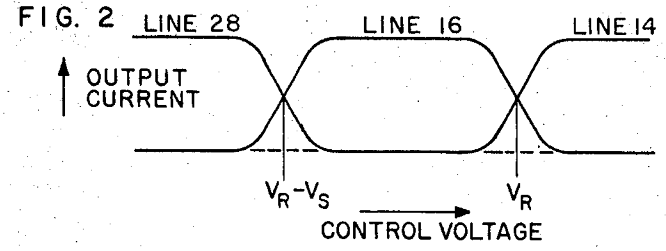
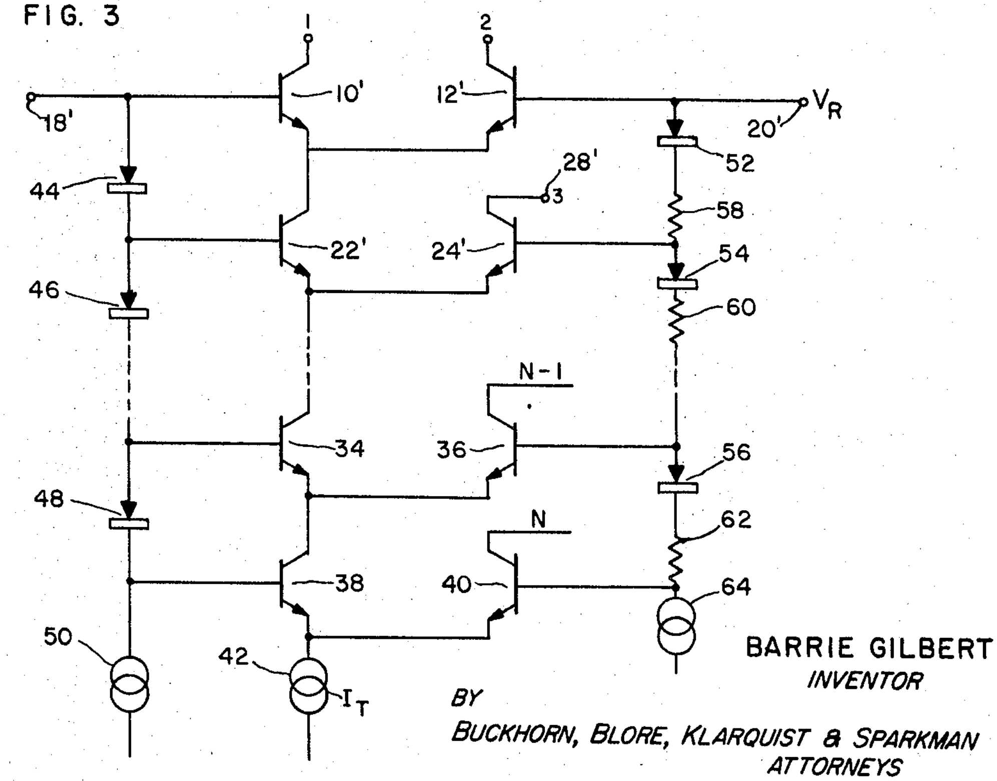
BARRIE GILBERT
*INVENTOR*
*BY*
*BUCKHORN, BLORE, KLARQUIST & SPARKMAN*
*ATTORNEYS*

Nov. 10, 1970 B. GILBERT 3,539,831
SWITCHING CIRCUIT INCLUDING PLURAL RANKS OF DIFFERENTIAL CIRCUITS
Filed June 15, 1967 2 Sheets-Sheet 2
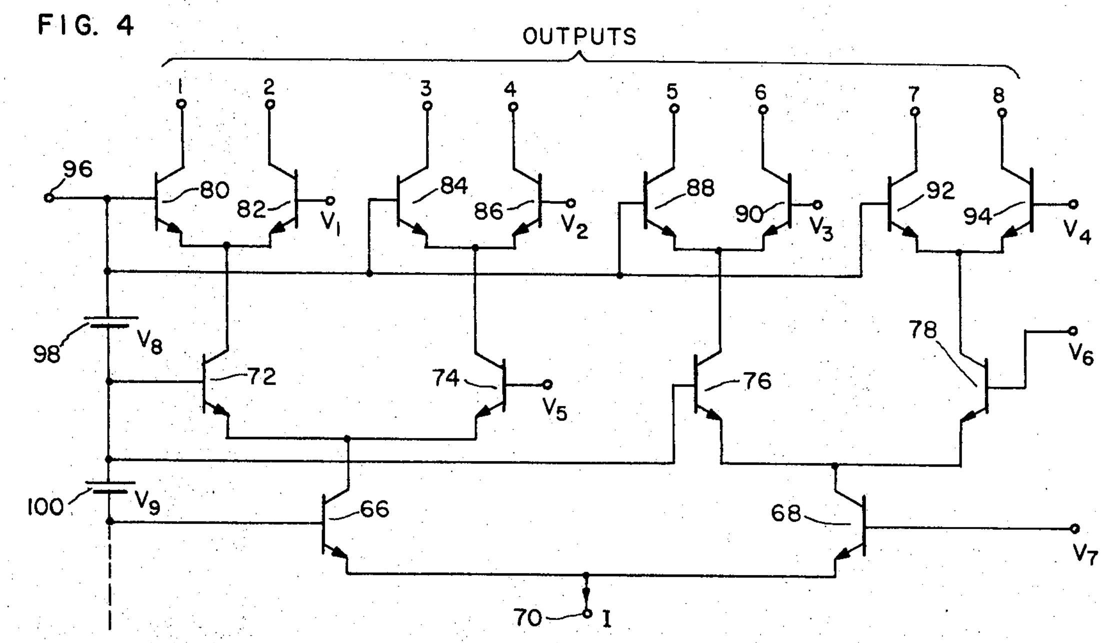
FIG. 4
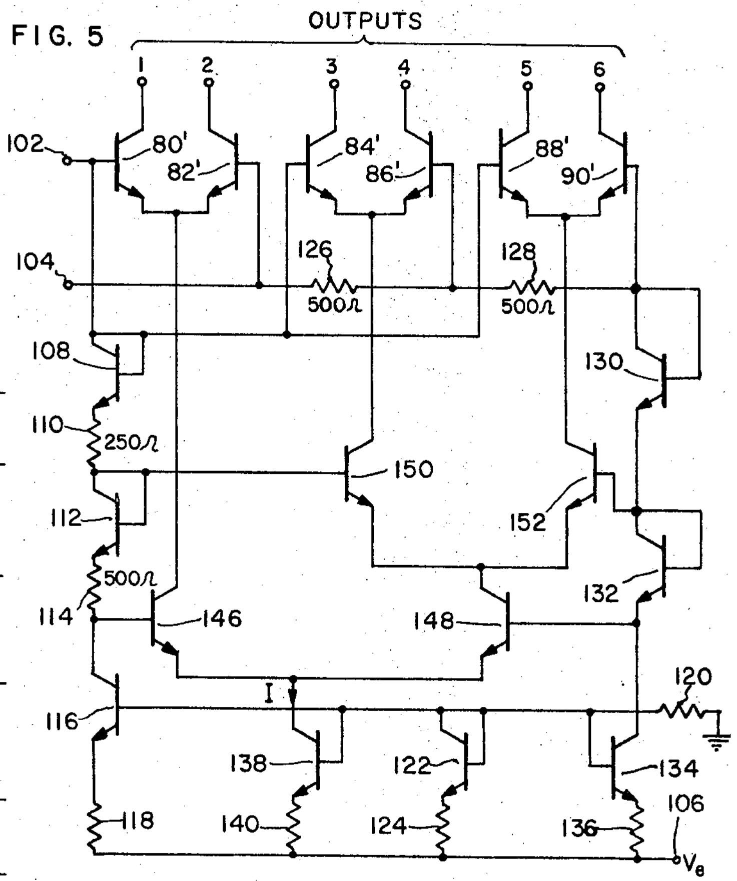
FIG. 6
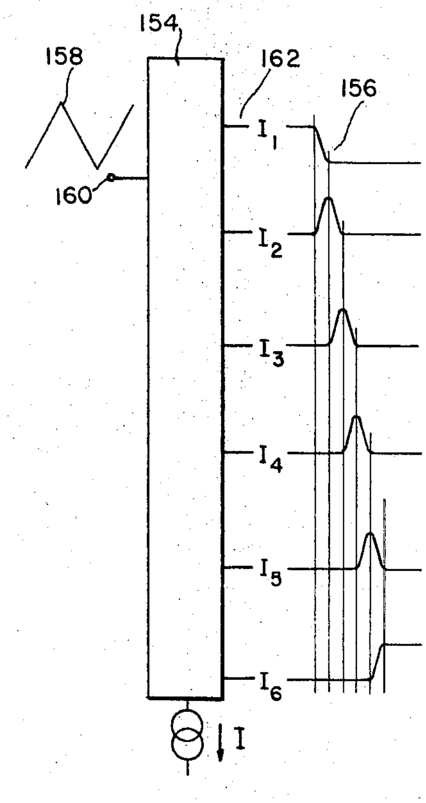
BARRIE GILBERT
*INVENTOR*
BY
*BUCKHORN, BLORE, KLARQUIST & SPARKMAN*
*ATTORNEYS*

United States Patent Office 3,539,831
Patented Nov. 10, 1970

3,539,831

SWITCHING CIRCUIT INCLUDING PLURAL RANKS OF DIFFERENTIAL CIRCUITS

Barrie Gilbert, Portland, Oreg., assignor to Tektronix, Inc., Beaverton, Oreg., a corporation of Oregon Filed June 15, 1967, Ser. No. 646,330
Int. Cl. H03k *5/20, 13/02*
U.S. Cl. 307—235 11 Claims

ABSTRACT OF THE DISCLOSURE

A switching circuit is provided comprising a plurality of differential amplifiers arranged in ranks with the differential outputs from lower rank amplifiers providing the inputs to higher rank amplifiers. Control terminals of the differential amplifiers are coupled together to a common analog control voltage, but the differential amplifiers are biased to switch their outputs at different control voltage values. In this manner, a given magnitude of control voltage will select a current path through the various ranks of differential amplifiers.

BACKGROUND OF THE INVENTION

Heretofore, various complicated electronic and relay devices have been employed to provide output current upon a selected output lead in response to a given level of control voltage. One system for accomplishing this result can, for example, comprise a number of separate voltage comparators receiving the same input voltage and arranged such that only one comparator produces an output at any one time. Also, plural analog-to-digital conversion circuits can be employed to provide nearly any combination of output values. However, many circuits that could be used are complex in nature involving a large number of different components and consuming appreciable space. Such schemes are not always readily adaptable to simplified integrated circuit techniques.

SUMMARY OF THE INVENTION

In accordance with the present invention, a switching circuit is provided for producing an output on one of a number of output leads in accordance with the magnitude of an applied control voltage or signal. The circuit includes plural differential circuits, each adapted to switch an input current between the output terminals in accordance with the control value applied thereto. The differential circuits are arranged in levels or ranks with the outputs of a lower rank differential circuit providing the inputs for higher rank differential circuits. A common input control voltage is applied to the various differential circuits, and bias voltage is applied between ranks to maintain proper operation. Also, an additional bias is applied to each differential circuit so that each one operates to switch outputs at a substantially different magnitude of the input control voltage value. A current supplied to the lowest rank differential circuit will be controlled through a sequence of ranks as a result of changes in the control voltage value so that such current appears at a particular terminal selected by the control voltage value.

The differential circuits preferably comprise transistor elements, and in such an embodiment few other components are required. Therefore, the circuit is quite adaptable to planar transistor integrated circuitry wherein a switching circuit may be accommodated on a semiconductor chip or the like.

It is therefore an object of the present invention to provide an improved switching circuit for supplying an output on an output lead selected by the magnitude of a control value.

It is a further object of the present invention to provide an improved circuit for selecting an output in accordance with an input control value, such circuit employing a minimum number and diversity of circuit elements.

It is another object of the present invention to provide an improved switching circuit for supplying an output selected according to the magnitude of the control value, which circuit is readily realizable by integrated semiconductor circuit techniques.

It is a further object of the present invention to provide an improved switching circuit for routing an input signal or current in accordance with an analog control value.

The subject matter which I regard as my invention is particularly pointed out and distinctly claimed in the concluding portion of this specification. The invention, however, both as to organization and method of operation, together with further advantages and objects thereof, may best be understood by reference to the following description taken in connection with the accompanying drawings wherein like reference characters refer to like elements.

DRAWINGS

FIG. 1 is a schematic diagram of the simplified form of the circuit according to the present invention;

FIG. 2 is a waveform chart illustrating operation of the FIG. 1 circuit;

FIG. 3 is a schematic diagram of another embodiment of the circuit according to the present invention;

FIG. 4 is a schematic diagram of a third circuit embodiment according to the present invention;

FIG. 5 is a schematic diagram of yet another circuit embodiment according to the present invention; and FIG. 6 illustrates operation of a circuit according to the present invention.

DETAILED DESCRIPTION

Referring to FIG. 1, illustrating a simplified embodiment of the present invention, a switching circuit comprises first and second differential circuits. A first differential circuit includes NPN transistors 10 and 12 having their emitters connected together and having their collectors connected to output terminals 14 and 16, respectively. The base of transistor 10 is connected to a first control terminal 18 while the base of transistor 12 is similarly connected to a control terminal 20.

A second differential circuit comprises NPN transistors 22 and 24 having their emitters connected together and supplied a current $I_T$ by an input current source 26. The collector of transistor 22 is connected in common to the emitters of transistors 10 and 12, while the collector of transistor 24 is connected to output terminal 28. A voltage source 30 is positioned with its positive terminal connected to the base of transistor 10 and its negative terminal coupled to the base of transistor 22. This voltage source provides the voltage designated $V_C$. A voltage source 32 is similarly disposed between the base of transistor 24 and the base of transistor 12, with the positive terminal being connected to the base of transistor 12. This voltage source supplies a voltage designated $V_C+V_S$. A bias voltage $V_R$ is applied to input terminal 20.

The operation of the FIG. 1 circuit will be explained with the aid of FIG. 2 waveform chart. The waveform chart of FIG. 2 plots output current at output lines 14, 16 and 28 versus the control voltage on control terminal 18. It should first be pointed out that the voltage source 30 supplies a voltage $V_C$ substantially equivalent to the voltage across a transistor junction whereby the proper collector bias is maintained on transistor 22. Source 32 supplies a similar voltage and also an additional voltage $V_S$ called the separation voltage. The separation voltage insures that the first and second differential circuits will operate at different values of control voltage. First assume that a very low control voltage is applied to control terminal 18. Also assume that this voltage is less than bias $V_R$ applied to the base of transistor 12 so that transistor 12 will be a conductive rather than transistor 10. Only one transistor of a pair will conduct at a time inasmuch as the emitters are connected together to provide differential action in a well-known manner. Also, if the control voltage is very low, the voltage applied to the base of transistor 22 from control terminal 18 by way of voltage source 30 will be less than the voltage applied to the base of transistor 24. Therefore transistor 24 will conduct rather than transistor 22 and the current $I_T$ from current source 26 will flow through transistor 24 appearing at output terminal 28. Now, assume the control voltage increases until it reaches the voltage value $V_R-V_S$, or the voltage bias applied at the base of transistor 24 (disregarding the $V_C$ collector bias voltage). When the control voltage at terminal 18 reaches this value, transistor 22 starts to conduct, and because at this point the base of transistor 12 is more positive than the base of transistor 10, substantially all of the collector current in transistor 22 flows out of the collector of transistor 12 and appears at output terminal 16. The current transition between transistors 24 and 22 is not abrupt, but may typically require about 100 millivolts of input change before the current is entirely switched. This changeover between outputs is illustrated in FIG. 2.

Now as the control voltage at terminal 18 further increases until it reaches $V_R$, the base of transistor 10 becomes more positive than the base of transistor 12. At this point the current switches from output terminal 16 to output terminal 14. Thus the current $I_T$ is switched or commutated over the output terminals in accordance with the analog value of control voltage applied to terminal 18. As noted, the circuit includes substantially all transistors with the exception of voltage sources 30 and 32, which may be implemented largely with transistors as hereinafter described.

In the FIG. 1 circuit, the first differential circuit comprising transistors 10 and 12 may be considered a first rank or first level differential circuit, while the differential circuit comprising transistors 22 and 24 may be considered a second rank or second level differential circuit, with one of its outputs providing an input to the first level differential circuit. While transistors are herein described as the active components in the differential circuits, it is readily appreciated that in a broader sense, other electronic control devices or amplifying devices, e.g. vacuum tubes, field effect transistors, or the like, may be substituted therefor.

Referring to FIG. 3 a circuit is illustrated which operates in the same manner as the circuit of FIG. 1, but which includes further levels or ranks. Primed reference numerals refer to components designated by similar reference numerals in FIG. 1. In the circuit of FIG. 3, the input current supplied in common to the emitters of transistors 22' and 24' is supplied from the collector of NPN transistor 34, forming part of a differentially connected pair including transistor 34 and NPN transistor 36, the emitters of which are connected together. In turn, the common emitter connection between transistors 34 and 36 is supplied a current from NPN transistor 38 connected differentially with NPN transistor 40 by means of a common emitter connection. The input current for transistors 38 and 40 is supplied from current source 42. The transistors in this circuit preferably never saturate.

In the circuit according to FIG. 3, diodes 44, 46, and 48, disposed in series between the base connections of transistors 10', 22', 34, and 38, provide the bias voltage $V_C$ as similarly provided by voltage source 30 in FIG. 1. The anode of diode 44 is connected to control terminal 18' and the anode of each successive diode is oriented towards the cathode of the previous diode. The series diode connection is supplied by means of a current source 50 such that the diodes all conduct in a forward direction. Each diode drops a voltage equivalent to the bias voltage $V_C$. Resistors might have been used for dropping this bias voltage. However, the diodes are also called upon as coupling means for the control voltage applied to terminal 18' and couple such control value to successive ranks of differential circuits. The impedance of the diodes is less than a resistor giving the same desired bias voltage drop, and therefore diodes are preferred. These diodes are typically implemented by using transistors each having their collector and base connected.

The bases of transistors 12', 24', 36, and 40 are also interconnected by means of a series circuit comprising diodes 52, 54, and 56, alternating with intervening resistors 58, 60, and 62. The diodes are poled such that the anode of diode 52 connects to terminal 20' while each successive diode is similarly oriented. The series combination of diode 52 and resistor 58 is positioned between the bases of transistors 12' and 24', and a similar pair constituting a diode and a resistor is located between each of the ranks. The series circuit is supplied current from a current source 64. Each combination of a diode and resistor drops a voltage $V_C+V_S$ corresponding to voltage source 32 in FIG. 1 such that a proper collector bias $V_C$ is supplied as well as a separation voltage $V_S$.

The circuit of FIG. 3 operates in a substantially similar manner to the circuit of FIG. 1 except that it provides further outputs. Here the outputs are numbered 1, 2, N–1 and N, it being understood that a larger number of ranks or levels may be included if desired. For this purpose, further differential circuits may be included at the location of the dashed connections in FIG. 3. The only limit to the number of circuits which may be thus combined is imposed by the reduction of collector currents due to additive recombination losses, and by supply line limitations.

Thus, for a very low control voltage applied at terminal 18', a current $I_T$ is provided at output N. Then, as the control voltage is increased, the current $I_T$ is switched upward in the switching circuit in the fashion plotted in FIG. 2.

The various differential circuits at different levels or ranks operate at different magnitudes of control voltage according to the separation bias applied to each one by means of a separation voltage $V_S$ therebetween. The circuit can, if desired, be remotely programmed or biased whereby the voltage at which each differential circuit operates may be remotely changed by changing the current from source 64.

It is noted the circuit according to FIG. 3 largely comprises semiconductor devices, i.e., transistors and diodes and a small number of resistors. It is therefore easily realizable by means of integrated circuit techniques.

Referring to FIG. 4, another embodiment of the present invention is illustrated wherein the number of differential circuits in each rank or level increases in binary fashion. Thus, a first differential circuit comprises NPN transistors 66 and 68 having their emitters connected together to receive a common input current, I, at terminal 70. The output terminal provided by the collectors of transistors 66 and 68 supply inputs respectively to a differential circuit comprising NPN transistors 72 and 74, and the differential circuit comprising NPN transistors 76 and 78. Then the four outputs provided from transistors 72, 74, 76 and 78 are supplied as inputs to a top or first rank comprising four differential circuits. These four circuits respectively comprise NPN transistors 80–82, NPN transistors 84–86, NPN transistors 88–90 and NPN transistors 92–94. The emitters of each pair are connected together to receive the input from the just lower rank and the respective output provided at the collector electrodes are here numbered 1 through 8.

A control voltage value is applied at control terminal 96 connected to the base electrodes of transistors 80, 84, 88 and 92. The terminal 96 is also coupled through a bias voltage source 98 to the bases of transistors 72 and 76, while the latter base connection is coupled by means of bias voltage source 100 to the base of transistor 66. Voltage sources 98 and 100 supply the proper bias so that the lower rank transistors can operate with the proper collector potential. Voltage source 98 provides a voltage designated $V_8$ which is positive with respect to terminal 96 while voltage source 100 provides a voltage $V_9$ with its positive terminal being connected to the base of transistor 72. The remaining transistor base terminals are connected to voltages designated $V_1$ through $V_7$. The voltages $V_1$ through $V_7$ are equivalent to bias voltage plus separation voltages as hereinbefore discussed. The separation voltages are arranged such that the various differential circuits operate to switch their current output from one collector to the other at different magnitudes of control voltage applied to terminal 96. The current, I, will be directed to one of the outputs 1 through 8 in accordance with the magnitude of control value applied at terminal 96. The circuit is arranged such that the following truth table is followed:

TABLE I

| | Control level | Transistors conducting | | | Output |
|---|---|---|---|---|---|
| Most positive | 1 | 80 | 72 | 66 | 1 |
| | 2 | 82 | 72 | 66 | 2 |
| | 3 | 84 | 74 | 66 | 3 |
| | 4 | 86 | 74 | 66 | 4 |
| | 5 | 88 | 76 | 68 | 5 |
| | 6 | 90 | 76 | 68 | 6 |
| | 7 | 92 | 78 | 68 | 7 |
| Most negative | 8 | 94 | 78 | 68 | 8 |

It is noted that only three transistors conduct at any one time in this particular circuit, and channel the current, I, to the proper output terminal. Hence, unlike the circuit of FIG. 3, the attenuation due to beta losses is constant for all output lines, and also generally less. It is noted that the circuit is otherwise similar to that described in FIG. 3 except, as hereinbefore mentioned, the number of differential circuits and the number of transistors increase in binary fashion from each lower rank or level to the next higher rank or level, all outputs being provided at the first or top rank or level. In the FIG. 3 circuit, on the other hand, the various outputs were provided at different levels in the circuit. It is seen that the FIG. 4 circuit may be expanded from the FIG. 3 circuit by increasing the number of differential circuits at the various levels and connecting each lower level output in FIG. 3 through higher level differential circuits until a final or top level is reached. Each of the configurations of FIG. 4 and FIG. 3 has its own advantages of simplicity and individual application as realized by integrated circuit techniques. There is no necessity for the number of levels to equal a binary number. FIG. 5 shows a six-level scheme, and ten-level schemes are equally feasible.

In order for the circuit of FIG. 4 to operate according to Table I as set fotrh above, the voltages $V_1$ through $V_7$ are arranged in a particular pattern. The voltage $V_1$ is the most positive of this group and must be exceeded before transistor 80 conducts to provide current output at output terminal 1. Disregarding for the moment the bias voltage $V_8$ from voltage source 98, the voltage $V_5$ is the next lower voltage level encountered. Thus, as the control voltage applied at terminal 96 decreases below $V_1$, it is said to change from control level 1 to control level 2 (see Table I) whereby transistor 80 ceases to conduct, and transistor 82 starts conduction. Then, as the control value drops to level 3, the transistor 72 ceases to conduct, and transistor 74 starts conduction. Current is withdrawn from the differential circuit 80–82 and applied to differential circuit 84–86. At control level 3, the control value is greater than $V_2$ so that transistor 84 conducts providing an output at terminal 3. However, as the control value drops to level 4, the current switches from transistor 84 to transistor 86. Below voltage $V_2$, the next lower voltage is $V_7$ applied to the base of transistor 68, that is, disregarding the bias values of $V_8$ and $V_9$. When the control voltage value drops from level 4 to level 5, transistor 66 ceases to conduct, and transistor 68 starts conduction. Thereupon, the current, I, is channeled to output terminal 5 through transistors 68, 76, and 88. The remainder of the circuit operates in a similar manner with the voltages $V_3$, $V_6$, and $V_4$ having descending values in that order (neglecting collector bias). As the control voltage value drops below these voltages, the output is successively provided at terminals 6, 7 and 8. In the FIG. 4 circuit, the current I, is channeled so that it appears at substantially only one output terminal at a time except when making a transition between output terminals, as depicted, for example, in FIG. 2.

In the last paragraph, the voltage values $V_1$ through $V_7$ were discussed without regard to voltage sources 98 and 100. Each of these voltage values as discussed above are referred to their own level or rank in the circuit, and it is understood that voltages $V_5$ and $V_6$ must be additionally lowered by the amount of $V_8$ while voltage $V_7$ must be lowered by the amount of $V_8+V_9$.

A further embodiment of the circuit according to the present invention is illustrated in FIG. 5. This embodiment is quite similar to the one illustrated in FIG. 4 but includes voltage divider coupling arrangements for providing collector bias and separation voltages. In this circuit, outputs numbered 1 through 6 are provided from first rank differential circuits having similar elements to those depicted in FIG. 4 and referred to by primed reference numerals. The FIG. 5 circuit is provided with a pair of control terminals 102 and 104 connected respectively to the base of transistor 80' and the base of transistor 82'. The control values are suitably applied from voltage sources having a predetermined internal impedance. One of the terminals, e.g. terminal 104, may be grounded while the analog control voltage from a voltage source is applied to terminal 102.

The control terminal 102 is coupled to a negative voltage $V_e$, at terminal 106, through a first voltage divider coupling chain. This coupling chain comprises NPN transistor 108, resistor 110, NPN transistor 112, resistor 114, NPN transistor 116 and resistor 118, serially connected in that order between terminal 102 and terminal 106. The base terminal is connected to the collector terminal in the case of transistors 108 and 112 so these transistors function as diodes. Since these elements are poled with the emitters oriented toward the negative terminal 106, these elements are normally conducting. They provide a voltage drop in the same manner as diodes 44, 46 and 48 in FIG. 3, semiconductor devices being used because of the enhanced coupling capabilities provided since their impedance is less than a resistor giving the same voltage drop. Transistors are employed in FIG. 5 inasmuch as such elements are readily available in a typical integrated semiconductor circuit. It is readily appreciated that diodes may be substituted for transistors 108 and 112 after the manner of FIG. 3, if so desired.

The base of transistor 116 is returned to ground through resistor 120 while the collector-emitter circuit is disposed in the aforementioned series chain wherein the emitter is oriented towards negative terminal 106. Transistor 116 operates as a current source supplying a substantially constant current to the chain after the manner of current source 50 illustrated in FIG. 3. A temperature compensating circuit comprising NPN transistor 122 and resistor 124 is connected with these elements serially arranged in that order between the base of transistor 116 and terminal 106. The collector and base of transistor 122 are connected together and also to the junction between resistor 120 and the base of transistor 116, while the emitter of transistor 122 is connected to resistor 124. This circuit tends to maintain the proper voltage across resistor 120 for application to the base of transistor 116 so that, despite changes in temperature, the current through transistors 108 and 112, as well as through resistors 110 and 114, will remain constant. The temperature compensation circuit operates in a well-known manner. Due to temperature change, an undesired change in current may tend to take place in transistor 116. However, the paralleled temperature compensating circuit will provide a new base voltage for transistor 116, whereby to maintain its output current substantially constant.

A second voltage divider chain is employed for providing further bias and separation voltages for the FIG. 5 circuit. The last-mentioned chain comprises resistor 126, resistor 128, NPN transistor 130, NPN transistor 132, NPN transistor 134 and resistor 136, serially arranged in that order between control terminal 104 and negative voltage terminal 106. Again, the bases of transistors 130 and 132 are connected to their respective collectors while their emitters are oriented towards terminal 106. Transistor 134 acts as a current source for this chain similar in position to current source 64 in FIG. 3. The emitter of transistor 134 is coupled through resistor 136 to terminal 106. The base of transistor 134 is connected to the junction between resistor 120 and transistor 122 whereby this current source is also temperature compensated through the action of transistor 122. It will be appreciated that due to the substantially constant current in both the above-described chains, desired preset voltages will be established therealong for proper biasing of the differential circuits.

The FIG. 5 circuit also employs a third current source including NPN transistor 138, wherein the collector of transistor 138 provides a current, I, for the FIG. 5 circuit. The emitter of transistor 138 is coupled to negative terminal 106 through resistor 140 while the base of transistor 138 is connected to the junction between resistor 120 and transistor 122 whereby this third current source is also temperature compensated.

The FIG. 5 circuit, having only six outputs, is somewhat more compact than the FIG. 4 circuit and illustrates that the number of differential circuits in each rank or level may vary in something other than a geometric progression. The current, I, from the collector of transistors 138 is coupled in common to the emitters of NPN transistors 146 and 148 providing a pair of selectable outputs at the collectors thereof. The base of transistor 146 is connected to the juction between resistor 114 and transistor 116 while the base of transistor 148 is connected to the junction between the emitter of transistor 132 and the collector of transistor 134. The collector of transistor 146 is connected directly to the common emitter connection between transistors 80′ and 82′ while the collector of transistor 148 connects in common to the emitters of NPN transistors 150 and 152. The base of transistor 150 is coupled to the junction between transistor 112 and resistor 110, and the base of transistor 152 is connected to the junction between transistor 130 and transistor 132. The outputs of transistors 150 and 152, provided at their collector terminals, are coupled respectively to a common emitter connection of differential circuit 84′–86′, and the common emitter connection of differential circuit 88′–90′.

The FIG. 5 circuit operates in a manner quite similar to the FIG. 4 circuit, but in the FIG. 5 circuit the various current sources are illustrated, as well as means for securing the various bias potentials. It will be seen that the chain including resistors 126 and 128, as well as transistors 130 and 132, should drop more voltage to the bases of transistors 152 and 148, respectively, so as to provide for both collector bias and separation voltage. Representative resistance values in ohms are indicated next to these resistors, as well as next to resistors 100 and 114. The transistors 108, 112, 130 and 132 largely provide the collector bias for the lower levels or ranks of differential circuits.

Assuming that terminal 104 is grounded, and the control voltage value applied to terminal 102 is above ground, then transistor 80′ will conduct providing an output at terminal 1. When the control voltage value at terminal 102 drops just below ground, transistor 82′ conducts providing an output at terminal 2. Now, if the control voltage value at terminal 102 drops further, the next differential circuit to switch is the circuit comprising transistors 146 and 148. In addition to transistor resistance, the resistance between terminal 104 and the base of transistor 148 is 1000 ohms. On the other hand, the corresponding resistance between terminal 102 and the base of transistor 146 is 750 ohms. Thus the 250-ohm difference will allow switching of differential circuit 146–148 only when the control voltage value at terminal 102 drops somewhat more. When it drops, current, I, will flow through transistor 148, transistor 150 and transistor 84′ to provide an output at terminal 3. If the control voltage value at terminal 102 continues to drop, the voltage at the base of transistor 84′ will drop below the voltage at the base of transistor 86′ causing the latter transistor to conduct. It is seen that 500 ohms of resistance are located between grounded control terminal 104 and the base of transistor 86′ for dropping a corresponding proportion of voltage. As the control voltage value at terminal 102 drops further, the differential circuit 150–152 will switch. It is noted that 1000 ohms of resistance are located between terminal 104 and the base of transistor 152, neglecting transistor resistance, while only 250 ohms of resistance are disposed between the base of transistor 150 and terminal 102, thereby requiring a proportionately larger drop at terminal 102 before the differential circuit 150–152 switches. If the control voltage value at terminal 102 drops even further, the differential circuit 88′–90′ is the last to switch inasmuch as a full 1000 ohms are located between the base of transistor 90′ and ground.

The utilization of diodes or transistors in the voltage divider chains instead of resistors alone improves circuit operation in that it reduces the width of the transition zone as the current passes from one output collector to the next. The circuit according to FIG. 5 has an additional advantage as compared with the circuit of FIG. 3 in that the amount of transistor base resistance introduced in the voltage divider chains is reduced, improving accuracy and further reducing the width of the transition zone as the current passes from one output collector to the next.

It is sometimes desirable to increase the width of the transition zone of current transfer between transistors. In the schematic diagram of FIG. 6, circuit 154, represented in block fashion, comprises a switching circuit according to the present invention, for example the circuit illustrated in FIG. 5. This circuit is designed such that the transition zone between transistor collectors overlap so that some differential circuit is essentially always in transition. That is, as soon as one differential circuit transfers current from one transistor to the other, the next differential circuit takes over to shift the current further. The result is a series of outputs which may be plotted versus change in control voltage value, as indicated at 156 in FIG. 6. As can be seen, the plot of each current output is essentially triangular. If a triangular waveform of a control voltage, 158, is applied to control terminal 160, wherein such triangular wave covers the whole range of control levels for circuit 154, the circuit will produce a continuously changing output at output terminals 162, continually and gradually shifting from one output terminal to the next. This arrangement is useful for what may be termed multiple scanning circuits and the like. As in the previous circuits, the total of the output currents is a constant, equaling the total input current, I. The effect of increasing the width of the transition zones can be procured through introduction of resistance in the emitter connections of transistors 80′, 82′, 84′, 86′, 88′, 90′, 146, 148, 150 and 152 in the FIG. 5 circuit, for example.

The circuit according to the present invention has other uses in addition to commutation of a steady current from one output terminal to another under the control of a control value magnitude. For example, the input current, instead of comprising a steady value from a current source, may alternatively comprise a complex signal or the like. For example, a complex signal applied to input terminal 70 in FIG. 4 can be delivered to any of the output terminals 1 through 8 under the control of the analog value applied to terminal 96. Of course, the circuits of FIG. 1, FIG. 3 or FIG. 5 can be similarly employed.

Also, the circuit can be employed as an analog to digital converter, or as a system for encoding pulse-code modulation. A circuit or circuits according to the present invention can be employed to produce a pulse-coded or digital output representing an applied control value. The output terminal energized in operation of the circuits according to the present invention is also a measure of the magnitude of the control value, and hence the circuits can be used as measuring devices.

While the circuit is described in connection with transistor technology and is particularly applicable to integrated or planar miniaturized circuits, the present invention in a broader sense can employ other controlled devices connected in differential circuits arranged in ranks or levels as hereinbefore described. A differential circuit is herein broadly considered as a circuit which switches an input current from one output terminal to another in response to a control value.

While I have shown and described several embodiments of my invention, it will be apparent to those skilled in the art that many changes and modifications may be made without departing from my invention in its broader aspects. I therefore intend the appended claims to cover all such changes and modifications as fall within the true spirit and scope of my invention.

I claim:

1. A switching circuit for switching current between selected outputs, comprising:

plural ranks of differential circuits wherein each differential circuit comprises a pair of electronic devices each having a current input terminal, a current output terminal, and a control terminal, said current input terminals being coupled together to comprise the input terminal of said differential circuit, the current output terminals of the respective electronic devices comprising the output terminals of said differential circuit, the control terminal of at least one of said electronic devices comprising the control terminal of said differential circuit, and the remaining control terminal of the remaining electronic device of the differential pair being biased at a D.C. potential, a control circuit coupling together the control terminals of the differential circuits for receiving a control value, means coupling output terminals of lower rank differential circuits to input terminals of higher rank differential circuits, the lowest rank comprising one differential circuit and the highest rank comprising a plurality of differential circuits for delivering selected outputs of said switching circuit, the differential circuits of the highest rank receiving their inputs from plural output terminals of lower rank differential circuits including output terminals of both electronic devices of lower rank differential circuits, and means for providing a current at the input terminal of the lowest rank differential circuit which current is channeled through said differential circuits to appear at a selected output of the highest rank of differential circuits in accordance with the control value applied to said control terminals of said differential circuits.

2. The circuit according to claim 1 wherein the number of differential circuits in each successively higher rank increases by geometric progression such that each output terminal of each differential circuit is coupled to a different differential circuit input terminal in the next higher rank, the input current applied to the first rank differential circuit being switchable by means of said control value to appear at one of the output terminals of highest rank of differential circuits, while always flowing through the same number of electronic devices in reaching a given output terminal of the highest rank of differential circuits.

3. The switching circuit according to claim 1 wherein each said electronic device comprises a transistor, wherein the transistors comprising a differential circuit have their emitters connected together to provide said input terminal of the differential circuit, and wherein the separate collectors provide the output terminals of the differential circuit, the base terminals of said transistors providing the said control terminals.

4. The switching circuit according to claim 3 wherein the means coupling output terminals of lower rank differential circuits to input terminals of higher rank differential circuits compirse direct connections from the collector of a transistor in a given rank to emitters of a differential pair in the next rank.

5. The switching circuit according to claim 1 wherein said means for providing a current at the input terminal of the lowest rank differential circuit comprises a current source.

6. The switching circuit according to claim 1 wherein the D.C. bias applied to remaining control terminals of said differential circuits is successively greater for differential circuits along the highest rank providing successive outputs from said switching circuit, said switching circuit including means for biasing control terminals of differential circuits of successively lower ranks with successively higher bias values, the remaining control terminal of differential circuits of lower rank also having intermediate values of bias applied thereto, neglecting the bias between ranks, for successively channeling current in order to successive differential circuits of the highest rank in the same order as the bias voltages applied to the remaining control terminals of the highest rank differential circuits.

7. A switching circuit for switching current between selected outputs, comprising:

plural ranks of differential circuits wherein each differential circuit comprises a pair of transistors each having an emitter terminal, a collector terminal, and a base terminal, said emitter terminals being coupled together to comprise the input terminal of said differential circuit, the collector terminals of the respective transistors comprising the output terminals of said differential circuit, the base terminal of at least one of said transistors comprising the control terminal of said differential circuit, and the base terminal of the remaining transistor of the differential pair being biased at a selected D.C. potential, a control circuit coupling together the control terminals of the differential circuits for receiving a control value, said control circuit comprising biasing means for applying different bias to differential circuits of successive ranks while coupling changes in the magnitude of said control value to said differential circuits, means coupling output terminals of lower rank differential circuits to input terminals of higher rank differential circuits, said means comprising direct connections from collector terminals of lower rank differential circuits to emitter terminals of higher rank differential circuits, and means for providing a current at the input terminal of the lowest rank differential circuit which current is channeled through said differential circuits to appear at a selected output terminal in accordance with said control value.

8. A switching circuit for switching current between selected outputs, comprising:

plural ranks of differential circuits wherein each differential circuit comprises a pair of transistors each having an emitter terminal, a collector terminal, and a base terminal, said emitter terminals being coupled together to comprise the input terminal of said differential circuit, the collector terminals of the respective transistors comprising the output terminals of said differential circuit, the base terminal of at least one of said transistors comprising the control terminal of said differential circuit, and the base terminal of the remaining transistor of the differential pair being biased at a D.C. potential, a control circuit coupling together the control terminals of the differential circuits for receiving a control value, said control circuit comprising biasing means for applying different bias to differential circuits of successive ranks while coupling changes in the magnitude of said control value to said differential circuits, the biasing means comprising voltage sources serially connected between control terminals of successive differential circuits in different ranks, means coupling output terminals of lower rank differential circuits to input terminals of higher rank differential circuits, said means comprising direct connections from collector terminals of lower rank differential circuits to emitter terminals of higher rank differential circuits, and means for providing a current at the input terminal of the lowest rank differential circuit which current is channeled through said differential circuits to appear at a selected output terminal in accordance with said control value.

9. A switching circuit for switching current between selected outputs, comprising:

plural ranks of differential circuits wherein each differential circuit comprises a pair of transistors each having an emitter terminal, a collector terminal, and a base terminal, said emitter terminals being coupled together to comprise the input terminal of said differential circuit, the collector terminals of the respective transistors comprising the output terminals of said differential circuit, the base terminal of at least one of said transistors comprising the control terminal of said differential circuit, and the base terminal of the remaining transistor of the differential pair being biased at a D.C. potential, a control circuit coupling together the control terminals of the differential circuits for receiving a control value, said control circuit comprising biasing means for applying different bias to differential circuits of successive ranks while coupling changes in the magnitude of said control value to said differential circuits, wherein the biasing means includes unilateral conductors connected in series between control terminals of successive differential circuits in different ranks, means coupling output terminals of lower rank differential circuits to input terminals of higher rank differential circuits, said means comprising direct connections from collector terminals of lower rank differential circuits to emitter terminals of higher rank differential circuits, and means for providing a current at the input terminal of the lowest rank differential circuit which current is channeled through said differential circuits to appear at a selected output terminal in accordance with said control value.

10. The switching circuit according to claim 9 further including a current source for providing current for said unilateral conductors in series.

11. The switching circuit according to claim 10 including second biasing means interconnecting the said remaining control terminals of said differential pairs so that switching of outputs in said pairs occurs at substantially different magnitudes of said control value.

References Cited

UNITED STATES PATENTS 2,653,231 9/1953 Cooke-Yarborough ---- 328—116
3,216,005 11/1965 Hoffman et al. ---- 307—235 XR DONALD D. FORRER, Primary Examiner J. ZAZWORSKY, Assistant Examiner U.S. Cl. X.R.

328—116, 150; 340—347